United States Patent
Kostecka et al.

(10) Patent No.: US 10,101,542 B2
(45) Date of Patent: Oct. 16, 2018

(54) MANAGED CONNECTIVITY SYSTEMS

(71) Applicant: CommScope Technologies LLC, Hickory, NC (US)

(72) Inventors: Ryan Kostecka, Waconia, MN (US); Steven J. Brandt, Savage, MN (US); Jonathan T. Lawson, Cottage Grove, MN (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/706,261

(22) Filed: Sep. 15, 2017

(65) Prior Publication Data

US 2018/0088286 A1 Mar. 29, 2018

Related U.S. Application Data

(60) Provisional application No. 62/400,471, filed on Sep. 27, 2016.

(51) Int. Cl.
*H02B 1/20* (2006.01)
*G02B 6/38* (2006.01)
*H05K 1/02* (2006.01)
*G02B 6/40* (2006.01)

(52) U.S. Cl.
CPC ......... *G02B 6/3879* (2013.01); *G02B 6/3825* (2013.01); *G02B 6/3893* (2013.01); *G02B 6/3895* (2013.01); *G02B 6/3897* (2013.01); *G02B 6/403* (2013.01); *H05K 1/0274* (2013.01)

(58) Field of Classification Search
CPC .... H05K 1/0274; G02B 6/403; G02B 6/3879; G02B 6/3825; G02B 6/3893; G02B 6/3895
USPC ........................................................ 361/828
See application file for complete search history.

(56) References Cited

U.S. PATENT DOCUMENTS

| | | | |
|---|---|---|---|
| 8,690,593 B2 | 4/2014 | Anderson et al. | |
| 8,923,013 B2 | 12/2014 | Anderson et al. | |
| 8,934,252 B2 | 1/2015 | Anderson et al. | |
| 8,934,253 B2 | 1/2015 | Anderson et al. | |
| 8,995,136 B2 | 3/2015 | Kostecka et al. | |
| 9,020,319 B2 | 4/2015 | Anderson et al. | |
| 9,128,262 B2 * | 9/2015 | Campbell | G02B 6/4452 |
| 9,140,859 B2 | 9/2015 | Anderson et al. | |
| 9,198,320 B2 | 11/2015 | Anderson et al. | |
| 9,213,363 B2 | 12/2015 | Anderson et al. | |
| 9,223,105 B2 | 12/2015 | Anderson et al. | |
| 9,265,172 B2 | 2/2016 | Anderson et al. | |
| 9,285,552 B2 | 3/2016 | Marcouiller et al. | |
| 9,417,399 B2 | 8/2016 | Anderson et al. | |
| 9,423,570 B2 | 8/2016 | Petersen et al. | |
| 9,532,481 B2 | 12/2016 | Anderson et al. | |
| 9,532,482 B2 | 12/2016 | Anderson et al. | |

(Continued)

*Primary Examiner* — Hung S Bui
(74) *Attorney, Agent, or Firm* — Merchant & Gould P.C.

(57) ABSTRACT

In managed connectivity systems, media reading interfaces at adapter blocks read information from storage devices attached to plug connectors. Media reading interfaces include one or more contact members. The contact members of certain types of media reading interfaces are held together by a base body to be handled as a unit. Certain types of media reading interfaces have support contacts that increase the beam length of the contact members. Certain types of media reading interfaces rock within the adapter block.

20 Claims, 16 Drawing Sheets

(56) References Cited

U.S. PATENT DOCUMENTS

| | | |
|---|---|---|
| 9,549,484 B2 | 1/2017 | Anderson et al. |
| 9,632,255 B2 | 4/2017 | Anderson et al. |
| 9,684,134 B2 | 6/2017 | Anderson et al. |
| 9,778,433 B2 * | 10/2017 | Kostecka ............. G02B 6/4454 |
| 2011/0255829 A1 | 10/2011 | Anderson et al. |
| 2015/0309277 A1 | 10/2015 | Krampotich et al. |
| 2016/0116697 A1 | 4/2016 | Kostecka et al. |
| 2016/0187594 A1 | 6/2016 | Marcouiller et al. |
| 2016/0309606 A1 | 10/2016 | Anderson et al. |
| 2017/0045702 A1 | 2/2017 | Petersen et al. |
| 2018/0100976 A1 * | 4/2018 | Patel ................... G02B 6/3897 |

* cited by examiner

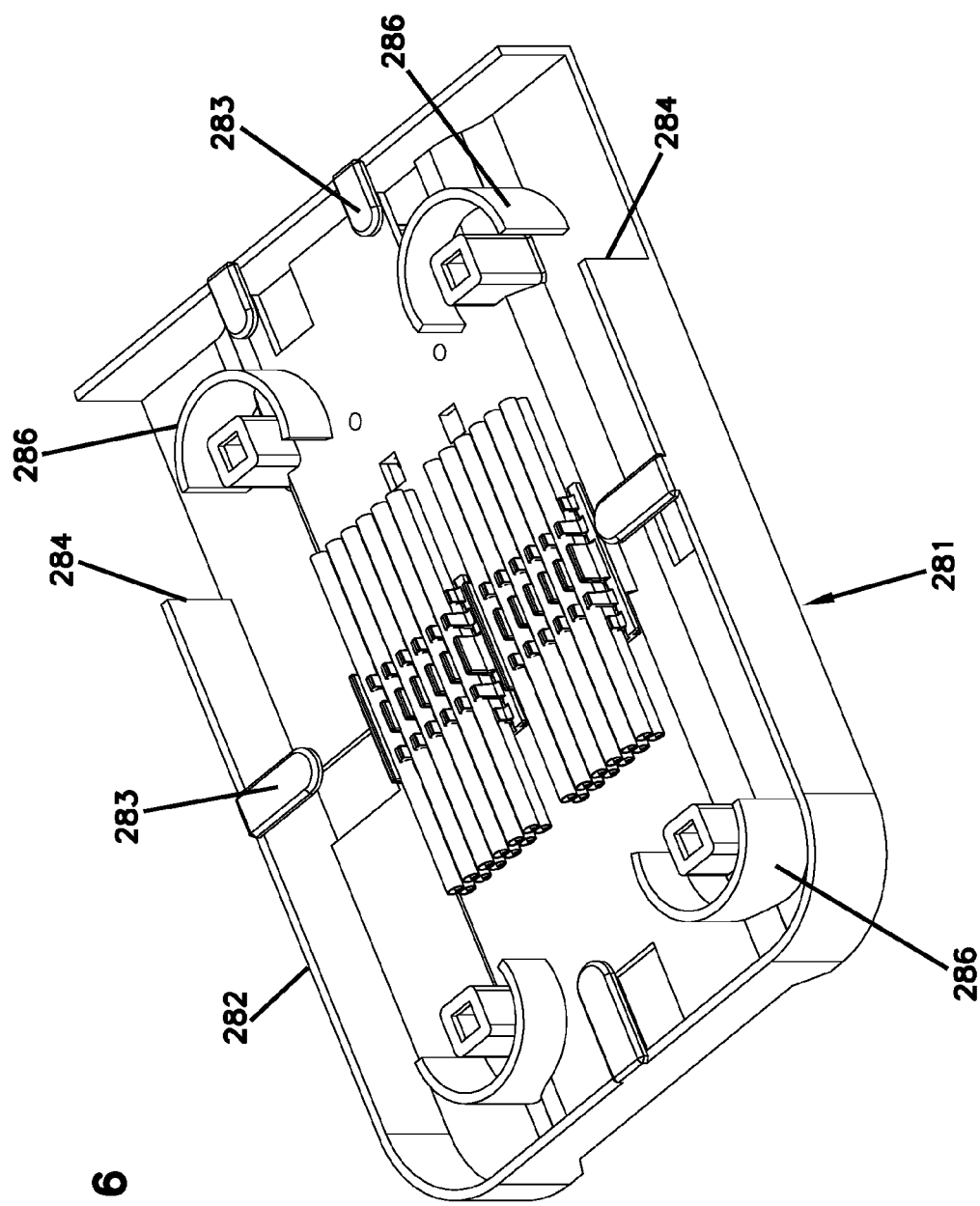

MANAGED CONNECTIVITY SYSTEMS

CROSS REFERENCE TO RELATED APPLICATION

This application claims the benefit of provisional application Ser. No. 62/400,471, filed Sep. 27, 2016, which is incorporated herein by reference in its entirety.

BACKGROUND

In communications infrastructure installations, a variety of communications devices can be used for switching, cross-connecting, and interconnecting communications signal transmission paths in a communications network. Some such communications devices are installed in one or more equipment racks to permit organized, high-density installations to be achieved in limited space available for equipment.

Communications devices can be organized into communications networks, which typically include numerous logical communication links between various items of equipment. Often a single logical communication link is implemented using several pieces of physical communication media. For example, a logical communication link between a computer and an inter-networking device such as a hub or router can be implemented as follows. A first cable connects the computer to a jack mounted in a wall. A second cable connects the wall-mounted jack to a port of a patch panel, and a third cable connects the inter-networking device to another port of a patch panel. A "patch cord" cross connects the two together. In other words, a single logical communication link is often implemented using several segments of physical communication media.

Network management systems (NMS) are typically aware of logical communication links that exist in a communications network, but typically do not have information about the specific physical layer media (e.g., the communications devices, cables, couplers, etc.) that are used to implement the logical communication links. Indeed, NMS systems typically do not have the ability to display or otherwise provide information about how logical communication links are implemented at the physical layer level.

SUMMARY

The present disclosure relates to communications panels which provide a higher density of connections within a given floor space, provide improved cable management structures, and provide physical layer management capabilities. One or more communications devices for providing such connections can be bundled into compact operational units, known as blades.

Some aspects of the present disclosure relates to a bladed chassis system including one or more blades mounted to a chassis. The chassis includes guides disposed within the interior and an electrical backplane. The blade is mounted to the guides to enable the blade to move relative to the chassis. The blade includes a circuit arrangement and a cover member. The circuit arrangement includes a flexible circuit board disposed at a front of the blade. The flexible circuit board includes a module connector. The circuit arrangement also includes a backplane connector at a rear of the blade. The backplane connector is configured to electrically couple to the electrical backplane of the chassis. The backplane connector is electrically coupled to the module connector. The cover member couples to the blade over a portion of the flexible circuit board. The cover member has an aperture that accommodates the module connector. The cover member also includes mounting structure.

In certain implementations, an adapter module is separable from the blade as a unit. The adapter module includes an adapter coupled to an electronics unit. The adapter defines at least two ports configured to receive and align respective plug connectors. The electronics unit has a blade connector that mates with the module connector of the circuit arrangement of the blade.

In certain implementations, the adapter module is a first adapter module. A second adapter module includes a second adapter coupled to a second electronics unit. The second adapter defines at least two ports configured to receive and align respective plug connectors. The second electronics unit has a second blade connector that mates with a second module connector of the circuit arrangement of the blade.

In certain examples, the first and second adapter modules are elongated along a length. The first and second adapter modules are disposed so that the length of each adapter module extends along the front of the blade.

In certain examples, the first and second adapter modules are spaced from each other. In an example, a processor is not disposed between the first and second adapter modules.

In certain implementations, the adapter module includes a media reading interface disposed at the adapter and includes a processor electrically connected to the media reading interface and to the blade connector.

In certain implementations, the adapter is one of a plurality of adapters of the adapter module. The media reading interface is one of a plurality of media reading interfaces of the adapter module. Each of the media reading interfaces is electrically coupled to the blade connector.

In certain examples, each of the adapters includes a media reading interface.

In certain implementations, the adapters are configured to receive LC plug connectors. In certain implementations, the adapters are configured to receive SC plug connectors. In certain implementations, the adapters are configured to receive MPO plug connectors. In certain implementations, the adapters are configured to receive RJ-45 connectors.

In certain implementations, the adapter module supports cable retention fingers. In certain examples, labels are disposed at distal ends of the cable retention fingers from the adapter module.

In certain implementations, the mounting structure of the cover member includes a latch finger disposed at opposite ends of the cover member.

In certain implementations, the mounting structure of the cover member includes latch fingers disposed at a central part of the cover member.

In certain implementations, the cover member couples to the blade without the use of separate tools.

In certain implementations, the adapter module couples to the cover member without the use of separate tools.

In certain implementations, an adapter unit mounts to the rear of the blade.

In certain implementations, the adapter unit mounted to the rear of the blade is mounted without the use of separate tools.

In certain implementations, a cable management structure is disposed at the blade between the front and rear of the blade. The cable management structure has a curved surface that faces away from a surface of the blade.

In certain implementations, a spice tray arrangement is disposed at the blade. In certain examples, a cable spool is mounted to the splice tray arrangement.

In certain implementations, the blade includes a latching arrangement for releasably locking to the chassis at a predetermined position.

In certain implementations, the circuit arrangement is configured to maintain an electrical connection between the backplane connector and the backplane of the chassis during movement of the blade relative to the chassis.

Other aspects of the disclosure are directed to a blade including a base; a circuit arrangement disposed at the base; a cover member installed at the blade; and an adapter module coupled to the cover member. The circuit arrangement includes a flexible circuit board disposed at the front of the base. The flexible circuit board includes a module connector. The circuit arrangement also includes a backplane connector at the rear of the base. The backplane connector is electrically coupled to the module connector. The cover member installed at the blade over a portion of the flexible circuit board. The cover member provides access to the module connector. The cover member also includes mounting structure. The adapter module is coupled to the cover member at the mounting structure. The adapter module defines a plurality of ports. The adapter module also includes an electronics unit including a processor and a media reading interface associated with a respective one of the ports. The adapter module includes a blade connector that mates with the module connector of the circuit arrangement.

In certain implementations, a cable manager carried by the cover member. The cable manager extends forwardly of the base to a distal end.

In certain implementations, a label panel coupled to the distal end of the cable manager.

In certain implementations, the blade does not have a processor separate from the processor of the electronics units of the adapter modules.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows:

FIGS. 13-16 illustrate an example splice tray arrangement suitable for use with the blade of FIG. 3.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

In general, media segments connect equipment of the communications network. Non-limiting examples of media segments include optical cables, electrical cables, and hybrid cables. This disclosure will focus on optical media segments. The media segments may be terminated with optical plug connectors, media converters, or other optical termination components.

Figure 1:
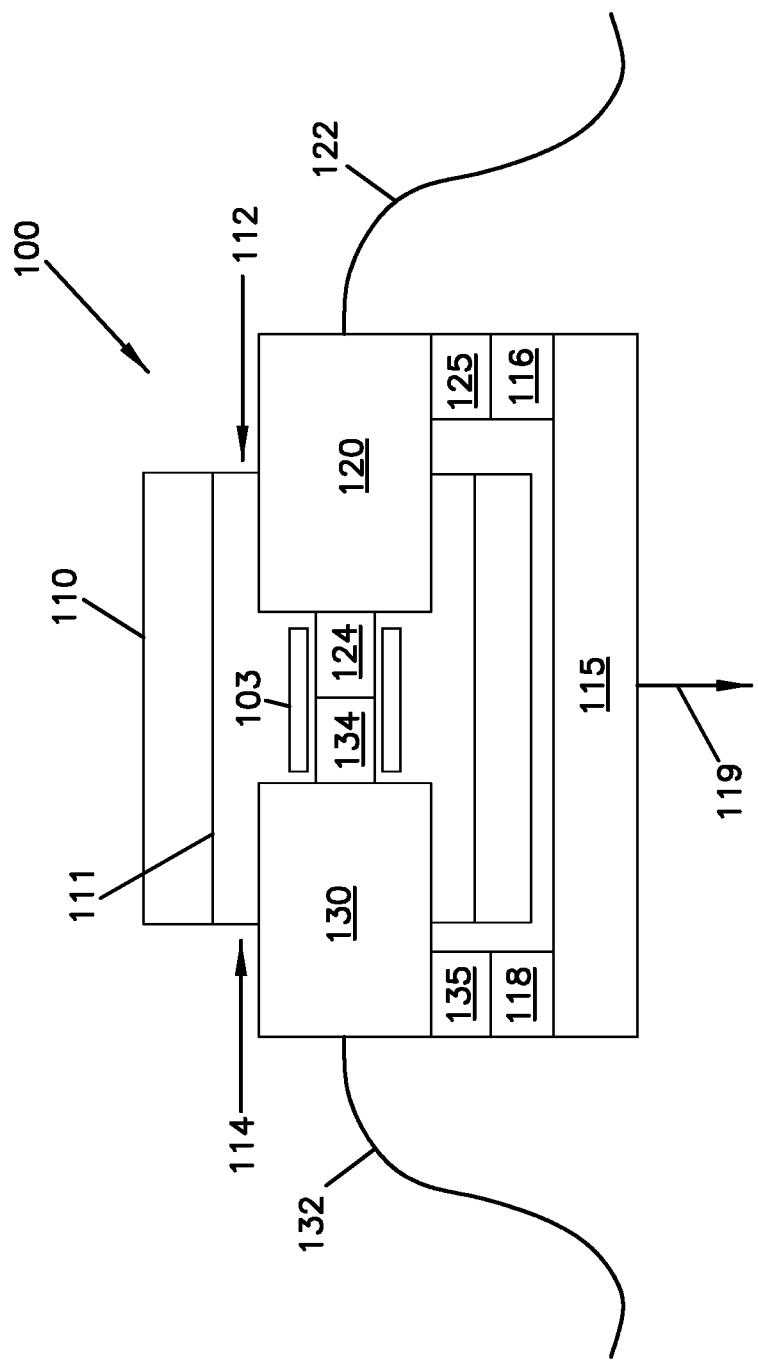
FIG. 1 is a schematic diagram showing two optical connectors with physical layer storage inserted at an optical adapter having media reading interfaces to access the physical layer storage of the connectors.

FIG. 1 is a schematic diagram of one example connection system 100 including an adapter block assembly (e.g., optical adapters, electrical sockets, wireless readers, etc.) 110 at which communications signals from a first media segment (e.g., an optical fiber, an electrical conductor, a wireless transceiver, etc.) 122 pass to another media segment 132. In some implementations, the media segments 122, 132 are terminated by connector arrangements 120, 130, respectively. The example adapter block assembly 110 connects segments of optical communications media in an optical network. In other implementations, however, the adapter block assembly 110 can connect electrical segments, wireless segments, or some combination thereof.

The adapter block assembly 110 includes a fiber optic adapter defining at least one connection opening 111 having a first port end 112 and a second port end 114. A sleeve (e.g., a split sleeve) 103 is arranged within the connection opening 111 of the adapter 110 between the first and second port ends 112, 114. Each port end 112, 114 is configured to receive a connector arrangement 120. Each fiber connector arrangement 120, 130 includes a ferrule 124, 134 through which optical signals from the optical fiber 122, 132, respectively, pass. The ferrules 124, 134 are held and aligned by a sleeve 103 to allow optical signals to pass between the ferrules 124, 134. The aligned ferrules 124, 134 of the connector arrangements 120, 130 create an optical path along which the communication signals may be carried.

In accordance with aspects of the disclosure, the communications network is coupled to or incorporates a data management system that provides physical layer information (PLI) functionality as well as physical layer management (PLM) functionality. As the term is used herein, "PLI functionality" refers to the ability of a physical component or system to identify or otherwise associate physical layer information with some or all of the physical components used to implement the physical layer of the communications network. As the term is used herein, "PLM functionality" refers to the ability of a component or system to manipulate or to enable others to manipulate the physical components used to implement the physical layer of the communications network (e.g., to track what is connected to each component, to trace connections that are made using the components, or to provide visual indications to a user at a selected component).

As the term is used herein, "physical layer information" refers to information about the identity, attributes, and/or status of the physical components used to implement the physical layer of the communications network. Physical layer information of the communications network can include media information, device information, and location information. Media information refers to physical layer information pertaining to cables, plugs, connectors, and other such physical media. Non-limiting examples of media information include a part number, a serial number, a plug type, a conductor type, a cable length, cable polarity, a cable pass-through capacity, a date of manufacture, a manufacturing lot number, the color or shape of the plug connector, an insertion count, and testing or performance information. Device information refers to physical layer information pertaining to the communications panels, inter-networking devices, media converters, computers, servers, wall outlets, and other physical communications devices to which the media segments attach. Location information refers to physical layer information pertaining to a physical layout of a building or buildings in which the network is deployed.

In accordance with some aspects, one or more of the components (e.g., media segments, equipment, etc.) of the communications network are configured to store physical layer information pertaining to the component as will be disclosed in more detail herein. Some components include media reading interfaces that are configured to read stored physical layer information from the components. The physical layer information obtained by the media reading interface may be communicated over the network for processing and/or storage.

For example, the adapter block assembly 110 of FIG. 1 can be configured to collect physical layer information from the connector arrangements 120, 130 terminating one or more of the media segments 122, 132. In some implementations, the first connector arrangement 120 may include a storage device 125 that is configured to store physical layer information pertaining to the segment of physical communications media 122 and/or to the first connector arrangement 120. In certain implementations, the connector arrangement 130 also includes a storage device 135 that is configured to store information pertaining to the second connector arrangement 130 and/or to the second optic cable 132 terminated thereby.

In one implementation, each of the storage devices 125, 135 is implemented using an EEPROM (e.g., a PCB surface-mount EEPROM). In other implementations, the storage devices 125, 135 are implemented using other non-volatile memory device. Each storage device 125, 135 is arranged and configured so that it does not interfere or interact with the communications signals communicated over the media segments 122, 132.

In accordance with some aspects, the adapter 110 is coupled to at least a first media reading interface 116. In certain implementations, the adapter 110 also is coupled to at least a second media interface 118. In certain implementations, the adapter 110 is coupled to multiple media reading interfaces. In an example, the adapter 110 includes a media reading interface for each port end defined by the adapter 110. In another example, the adapter 110 includes a media reading interface for each connection opening 111 defined by the adapter 110. In other implementations, the adapter 110 can include any desired number of media reading interfaces 116, 118.

In some implementations, at least the first media reading interface 116 is mounted to a printed circuit board 115. In some implementations, the printed circuit board 115 also can include the second media reading interface 118. The printed circuit board 115 of the adapter 110 can be communicatively connected to one or more programmable processors and/or to one or more network interfaces (see data line 119 of FIG. 1). The network interface may be configured to send the physical layer information to a physical layer data management network. Examples of data management networks can be found in U.S. Provisional Application No. 61/760,816, filed Feb. 5, 2013, and titled "Systems and Methods for Associating Location Information with a Communication Sub-Assembly Housed within a Communication Assembly," the disclosures of which are hereby incorporated herein by reference.

When the first connector arrangement 120 is received in the first port end 112 of the adapter 110, the first media reading interface 116 is configured to enable reading (e.g., by an electronic processor) of the information stored in the storage device 125. The information read from the first connector arrangement 120 can be transferred through the printed circuit board 115 to the physical layer data management network. When the second connector arrangement 130 is received in the second port end 114 of the adapter 110, the second media reading interface 118 is configured to enable reading (e.g., by an electronic processor) of the information stored in the storage device 135. The information read from the second connector arrangement 130 can be transferred through the printed circuit board 115 or another circuit board to the physical layer data management network.

In some such implementations, the storage devices 125, 135 and the media reading interfaces 116, 118 each include at least three (3) leads—a power lead, a ground lead, and a data lead. The three leads of the storage devices 125, 135 come into electrical contact with three (3) corresponding leads of the media reading interfaces 116, 118 when the corresponding media segment is inserted in the corresponding port. In other example implementations, a two-line interface is used with a simple charge pump. In still other implementations, additional leads can be provided (e.g., for potential future applications). Accordingly, the storage devices 125, 135 and the media reading interfaces 116, 118 may each include four (4) leads, five (5) leads, six (6) leads, etc.

FIGS. 2-16 illustrate various example implementations of connection system 100 implemented as bladed panel systems 200 suitable for mounting to communications equipment racks, cabinets, or other structures. The bladed panel system 200 includes a chassis 201 (FIG. 2) configured to receive one or more communications blades 210 (e.g., see FIGS. 3 and 13).

Each blade 210 is configured to connect segments of communications media carrying communications signals (e.g., signals 51 of FIG. 1). In certain implementations, each blade 210 includes one or more media couplers 250 that are configured to connect together media segments. For example, the media couplers 250 may connect segments received at a rear of the chassis 201 with segments received at a front of the chassis 201. For the sake of convenience, media segments routed to the rear of the chassis 201 will be referred to herein as "incoming" media segments and the media segments routed to the front of the chassis 201 will be referred to herein as "outgoing" media segments. However, each set of media segments may carry incoming signals, outgoing signals, or both. In certain implementations, one or more media couplers 250 of the blades 210 include media reading interfaces to read physical layer information from the media segments. In certain examples, each blade 210 includes a circuit arrangement to which the media reading interfaces are electrically coupled.

Figure 2:
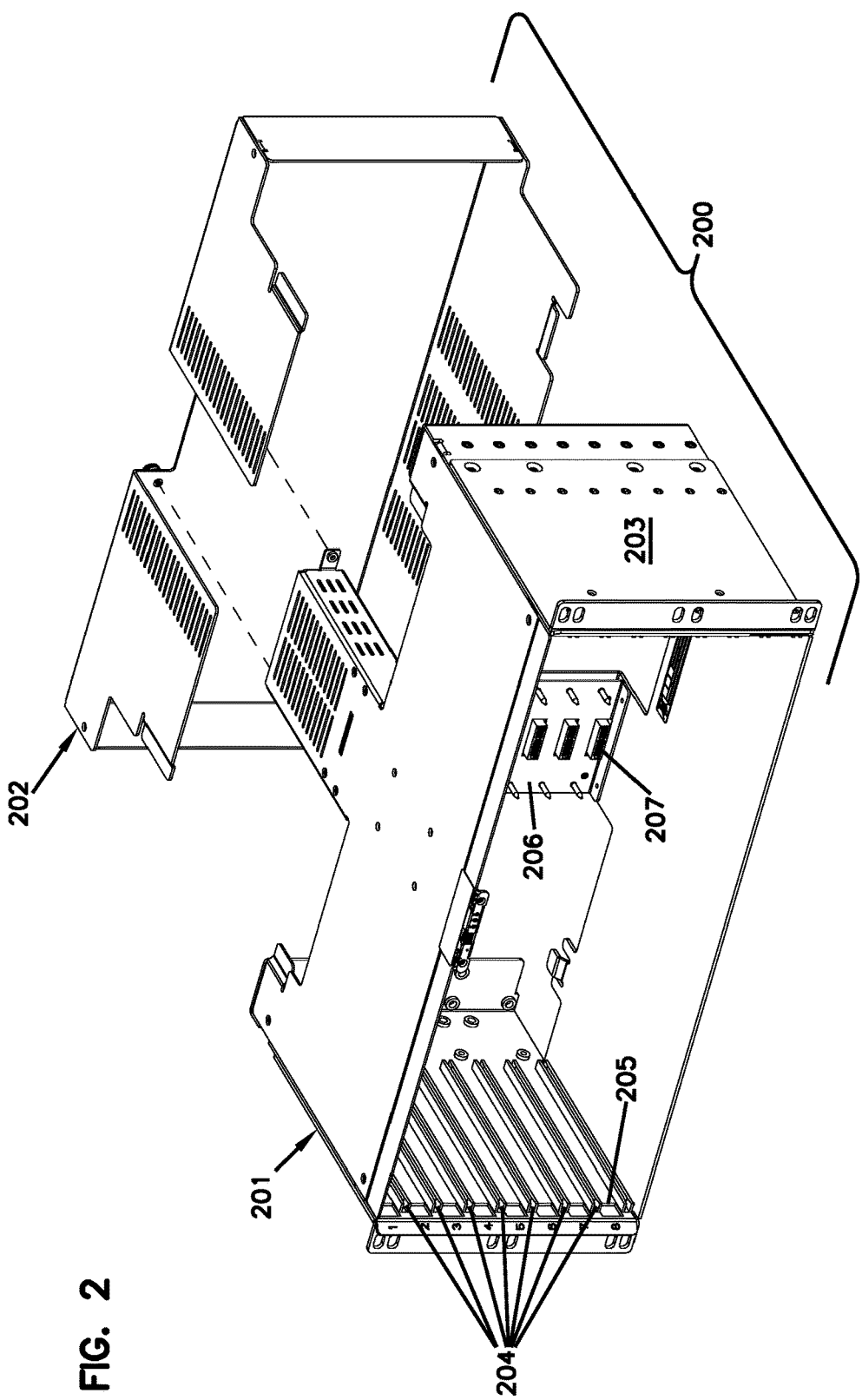
FIG. 2 is a perspective view of an example chassis including an example backplane.

One example chassis 201 is shown in FIG. 2. The chassis 201 has opposing side walls 203 interconnected by opposing major surfaces to form a housing defining an interior. The chassis 201 defines an open front and an open rear. In other implementations, one or both of the front and rear can be at least partially closed. The interior of the chassis 201 includes guides 204 that enable the blades 210 to move (e.g., slide forwardly and rearwardly) relative to the chassis 201. For example, the guides 204 may enable the blades 210 to each move from a closed (retracted) position to one or more extended positions relative to the chassis 201.

The chassis 201 includes a backplane 206 including one or more connector ports (e.g., card-edge ports) mounted to a circuit board. A circuit arrangement of each blade 210 positioned in the chassis 201 connects to the backplane 206 of the chassis 201. For example, the backplane 206 may include one or more blade ports 207, each of which is configured to receive a connection end of a circuit arrangement 220 of a blade 210. In some implementations, the blades 210 are connected to the backplane 206 only when the blades 210 are in the closed position relative to the chassis 201. In other implementations, however, the blades 210 are connected to the backplane 206 when the blade 210 is in both the closed position and at least one extended position as will be disclosed in more detail herein.

A chassis processor also may be electrically coupled to the backplane 206. The chassis processor functions as the interface between the panel system 200 and the data management network. The chassis processor may be connected to a backplane 206 to manage the media reading interfaces, either directly or via processors on the individual blades 210. The chassis processor also may connect the backplane 206 to the data management network. In certain implementations, the chassis processor also may include memory (e.g., an EEPROM chip) and other electronic circuitry so that physical layer information obtained at the blades 210 can be stored in the memory of the chassis processor.

In accordance with some aspects, each blade 210 may be secured into one or more positions relative to the chassis 201. For example, each blade 210 may be latched or otherwise secured in the closed position. In certain implementations, each blade 210 includes a latching arrangement 215 (FIG. 3) that is configured to secure the blade 210 in one or more extended positions relative to the chassis 201. Each blade 210 with the example latching arrangement includes one or more latching tabs configured to engage with the chassis housing 201 to lock the blade 210 in one of a plurality of positions.

In certain implementations, at least one side 203 of the chassis housing 201 defines latching openings 205 that receive the latching tabs of the blades 210. In certain implementations, both sides of the blade 210 may include one or more latching tabs configured to cooperate with latching openings 205 defined in both sides 203 of the chassis 201. In some implementations, the chassis 201 defines one latching opening 205 for each blade 210 at the front of the chassis 201. In other implementations, the chassis 201 defines a latching opening 205 at the front of each side wall 203 for each blade 210 to be received. In still other implementations, each side 203 of the chassis 201 may define multiple openings 205 for each blade 210.

The rear of the chassis 201 is configured to facilitate routing and securement of the incoming media segments. In some implementations, a cover 202 may be positioned at the rear of the chassis 201 to provide protection for media segments routed to the rear of the chassis 201. In certain implementations, vents may be provided in the top and/or the bottom of the rear cover 202 to inhibit overheating of the chassis processor. Cable tie locations or management structures may be provided at the rear cover 202.

Non-limiting examples of management structures include cable retention clamps, cable retention fingers, and cable fanouts. In other implementations, other types of management structures (e.g., spools, radius limiters, cable ties, etc.) may be utilized at the rear of the chassis 201. Which management structure is appropriate may depend on the types of incoming media segments and the configuration of the coupler arrangement installed on each blade 210 to be held within the chassis 201.

Figure 3:
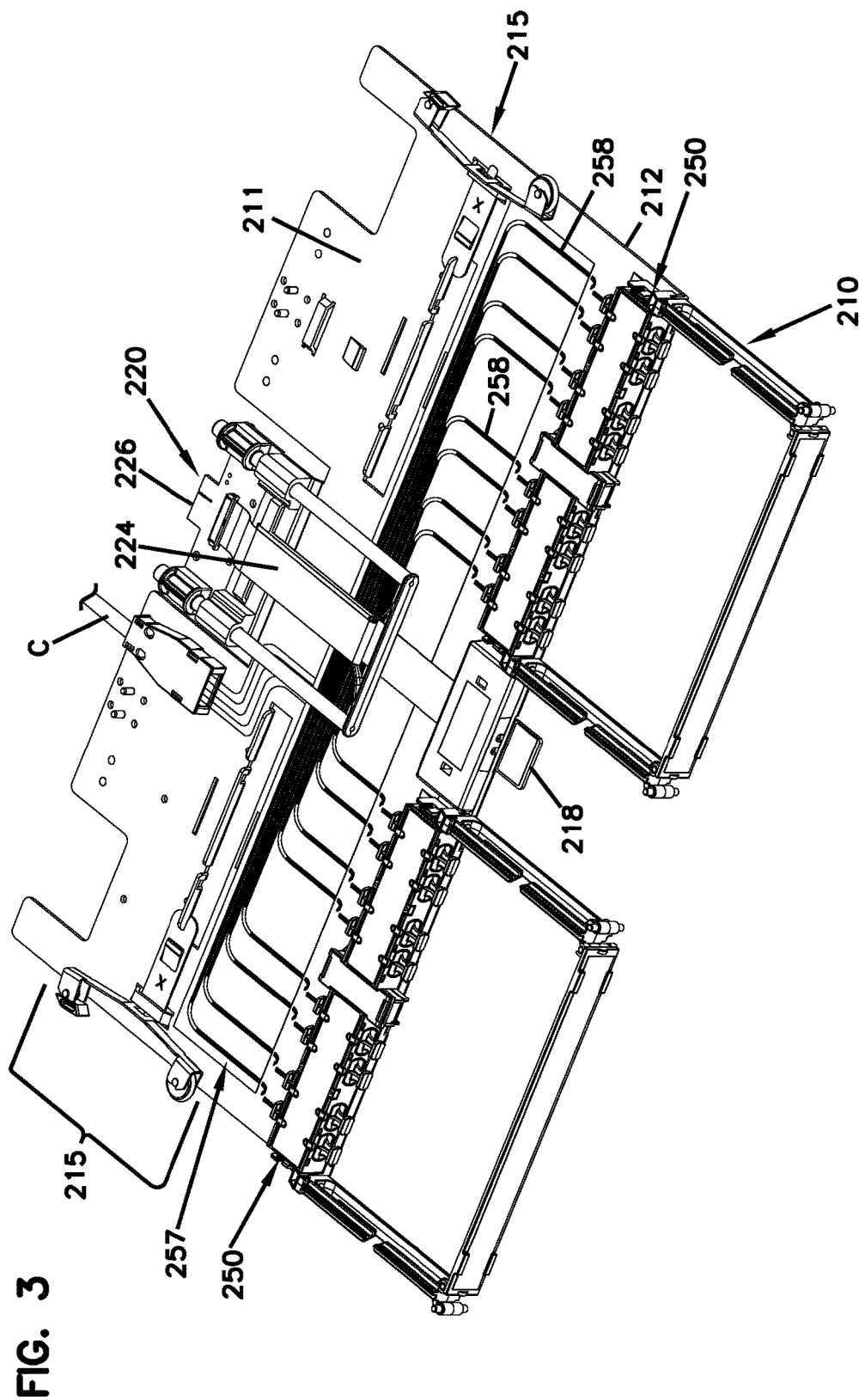
FIG. 3 is a perspective view of an example blade configured to mount within the chassis of FIG. 2.
Figure 4:
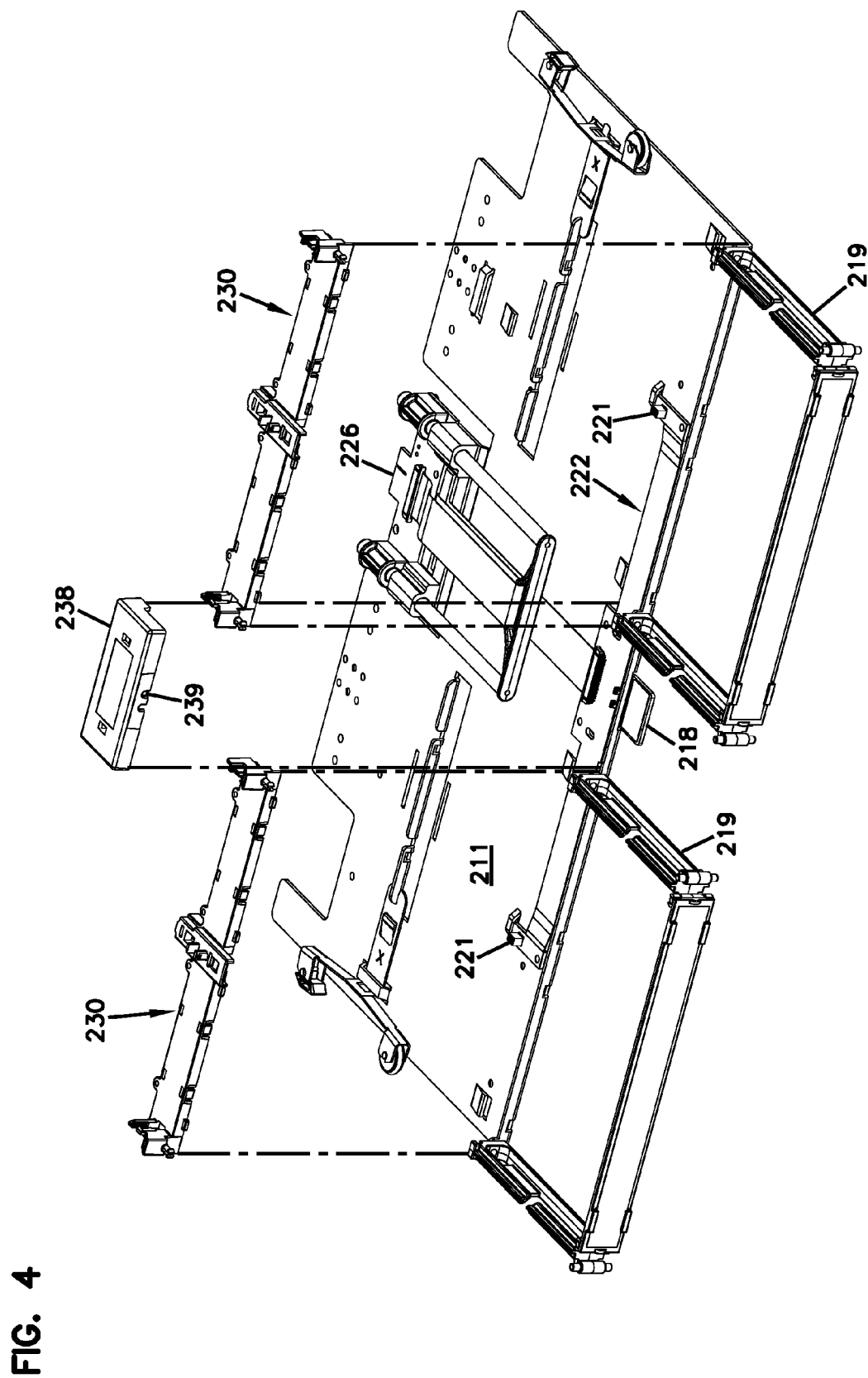
FIG. 4 is a perspective view of the example blade of FIG. 3 with media couplers and fibers removed for clarity and cover members exploded upwardly from the blade to show a first portion of a circuit arrangement.

FIG. 3 illustrates an example blade 210 suitable for use with the chassis 201. In general, each blade 210 includes a base 211 having a front, a rear, and opposing sides. A handle 218 extends from the front of the base 211 to facilitate positioning of the blade 210 relative to the chassis 201. Latching arrangements 215 are positioned at opposite sides of the base 211. Each latching arrangement 215 includes one or more outwardly biased stop members that engage the apertures 205 defined at the front of the chassis 201.

Various components can be installed on the blade 210 depending on the applications for the specific blade 210. For example, different types of media couplers 250 can be installed on the blade as will be discussed herein. In some examples, loose fibers extend across the blade 210 from the rear to the front. In other examples, the optical fibers can be fixed to a substrate, routed through a splice tray arrangement, wrapped around a storage spool, or otherwise managed on the blade 210. Example components for managing the optical fibers on the blade 210 will be described in more detail herein.

The blade shown in FIG. 3 is loaded with example media couplers 250. In the example shown, the media couplers 250 are configured to optically couple together MPO plug connectors. In other examples, the media couplers 250 can be configured to optically couple together SC plug connectors, LC plug connectors, etc. In still other examples, the media couplers 250 can be configured to receive RJ-45 plug connectors or other types of plug connectors. In the example shown, each media coupler defines a plurality of incoming ports and a plurality of outgoing ports. In other examples, however, each media coupler can define a single incoming port and a single outgoing port.

The example blade 210 shown in FIG. 3 is pre-loaded with the media couplers 250, which are pre-cabled with an outgoing cable C prior to deployment as will be described in more detail herein. A distal end of the outgoing cable C can be connectorized, spliced, or otherwise coupled to the optical network when the blade 210 is deployed at the chassis 201. In other implementations, however, the blades 210 can be cabled in the field. In still other implementations, the media couplers 250 can be installed at the blades in the field (e.g., after installation of the blade 210 in the chassis 201).

In accordance with some aspects, the media couplers 250 include media reading interface configured to read information stored on memory devices carried by the plug connectors or otherwise carried by the media segments received at the media couplers 250. In certain implementations, each media coupler 250 includes at least one media reading interface. Example media reading interfaces are disclosed in U.S. Pat. No. 8,690,593, the disclosure of which is hereby incorporated herein by reference.

In certain implementations, the blade 210 carries a circuit arrangement 220 that acts as an electrical bridge between the media reading interfaces and the backplane 206 of the chassis 201. The circuit arrangement 220 includes a first portion 222 disposed at the media couplers 250 and a second portion 226 configured to connect to the backplane 206. The second portion 226 is electrically coupled to the first portion 222 so that the circuit arrangement 220 carries the information obtained by the media reading interfaces to the backplane 206.

The second portion 226 is configured to move relative to the first portion 222. In an example, the first portion 222 is electrically coupled to the second portion 226 by a flexible cable 224. Accordingly, the blade 210 can be moved relative to the backplane 206 without disconnecting the media reading interfaces that are carried by the blade 210 from the backplane 206. Additional details for how media reading interfaces of media couplers can remain connected to the backplane 206 are provided in U.S. Pat. No. 9,223,105, the disclosure of which is hereby incorporated herein by reference.

In accordance with some aspects of the disclosure, the blade 210 is configured to receive example media couplers 250 configured to hold multiple media connections. In certain examples, each media coupler 250 defines a plurality of ports 252 at which to receive plug connectors of the media segments being connected. In certain implementations, each media coupler 250 includes a local processor that manages the media reading interfaces of the media coupler 250. The local processor is carried by the media coupler 250 as a unit. Each media coupler 250 also includes an output connector 254 by which the processor and/or media reading interfaces are accessible.

The first portion 222 of the circuit arrangement 220 includes one or more coupler connectors 221 to which the output connector 254 of a media coupler 250 can be coupled. In the example shown in FIG. 4, the first portion 222 includes two coupler connectors 221. In other examples, however, the first portion 222 could include any desired number of coupler connectors 221.

In certain implementations, the first portion 222 of the circuit arrangement 220 does not include a processor directly attached thereto. In certain implementations, the second portion 226 of the circuit arrangement 220 does not include a processor directly attached thereto. In certain implementations, no portion of the circuit arrangement 220 includes a processor directly attached thereto. Rather, in certain examples, each media coupler 250 may have a local processor that manages the media reading interfaces for the media coupler 250 and that electrically connects to the first portion 222 of the circuit 220 as will be described in more detail herein.

In certain implementations, a cover member 230 can be mounted to the blade 210 to protect the first portion 222 of the circuit 220 and/or to facilitate mounting of the media couplers 250 to the blade 210. In some implementations, a cover member 230 can be provided for each coupler connector 221 of the first portion 222. In other implementations, a single cover member 230 can be provided.

Example media couplers 250 suitable for use in a blade 210 are shown in FIGS. 3 and 7-9. Each media coupler 250, 250A, 250B includes a plurality of optical adapters coupled to an electronics unit. The optical adapters define plug receiving ports 252. The electronics unit includes a circuit board and a processor. Media reading interfaces at the optical adapters electrically couple to the circuit board of the electronics unit. Each media coupler 250, 250A, 250B includes an output connector 254 that is electrically coupled to the electronics unit. Each media coupler 250, 250A, 250B also includes mounting members 256 configured to secure the media coupler 250, 250A, 250B to the blade 210 as will be described in more detail herein.

Figure 7:
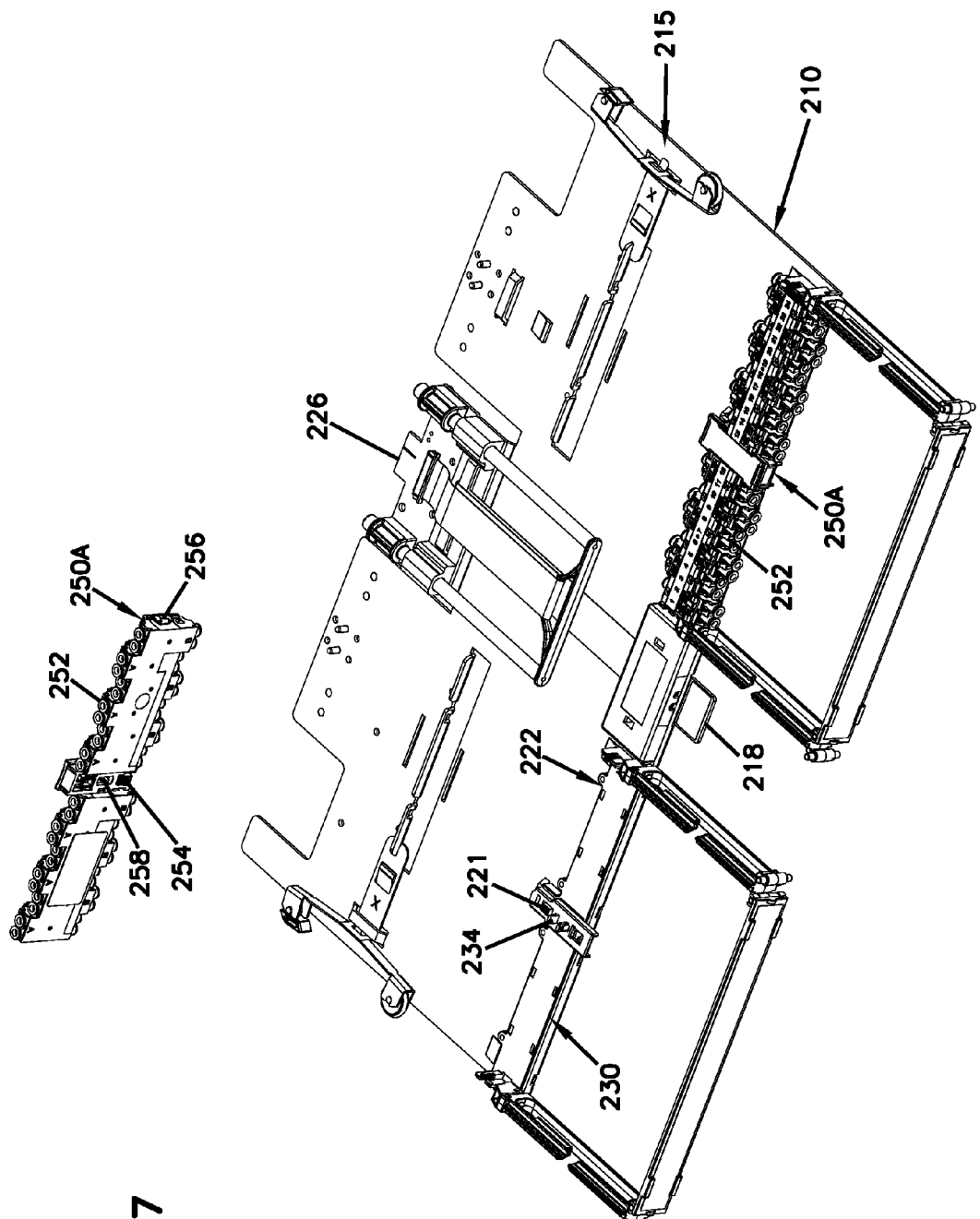
FIG. 7 shows an example blade with an example media coupler exploded upwardly and rotated to show a bottom of the first media coupler.
Figure 8:
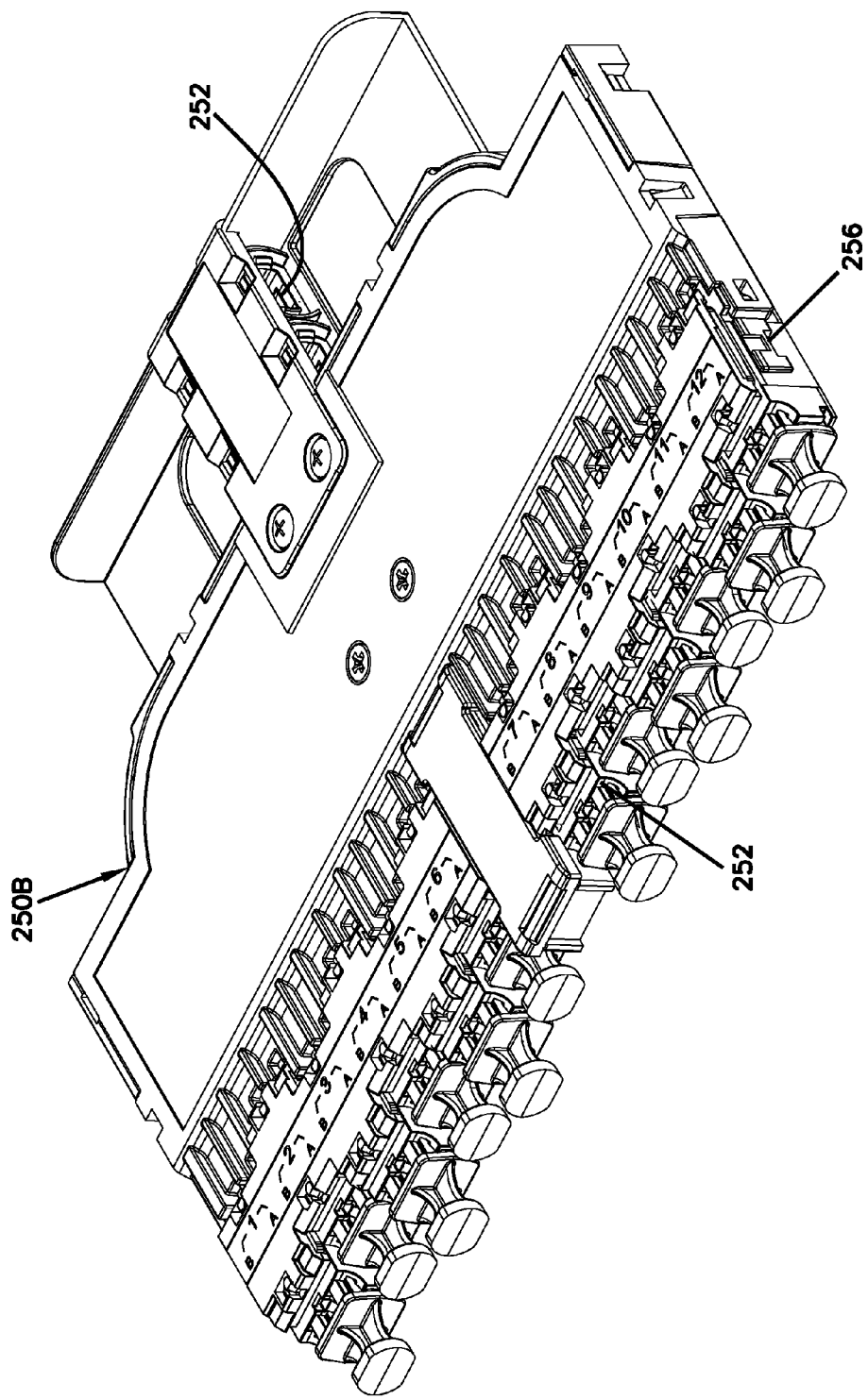
FIGS. 8 and 9 illustrate perspective views of another example media coupler suitable for use with the blade of FIG. 3.
Figure 9:
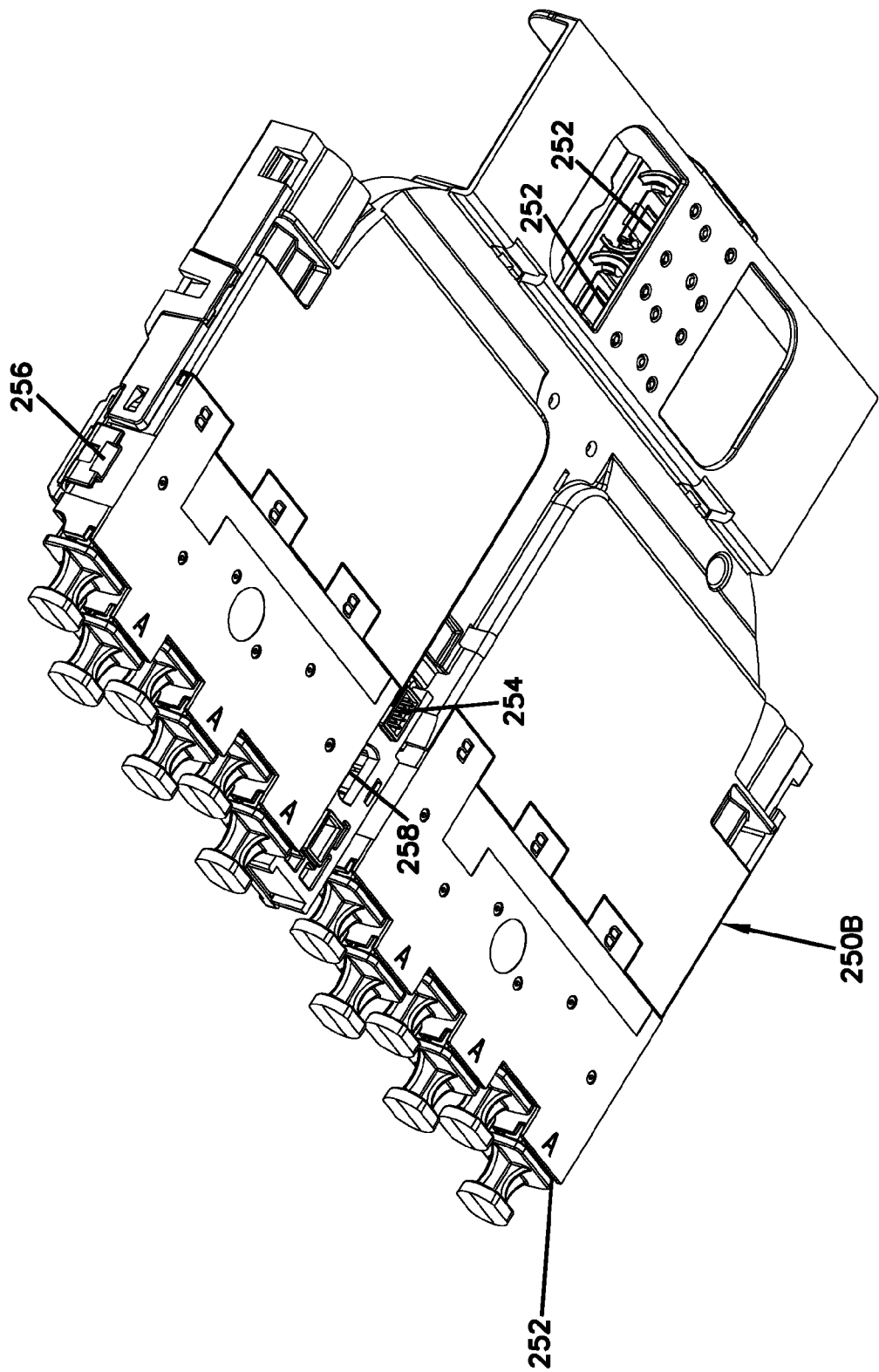

The example media coupler 250 shown in FIG. 3 is an adapter block configured to receive and optically couple MPO plug connectors at the front and rear of the adapter block. The example media coupler 250A shown in FIG. 7 is an adapter block configured to receive and optically couple LC plug connectors received at the front and rear of the adapter block. The example coupler 250B shown in FIGS. 8 and 9 is a cassette configured to receive LC plug connectors at the front and MPO plug connectors at the rear. The cassette optically couples the LC plug connectors to the MPO plug connectors.

For convenience, the remainder of this disclosure will refer to media coupler 250. It will be understood, however, that this recitation refers to media coupler 250 of FIG. 3, media coupler 250A of FIG. 7, media coupler 250B of FIG. 8, and any other desired media coupler including electrical jacks, SC optical adapter blocks, etc.

Figure 5:
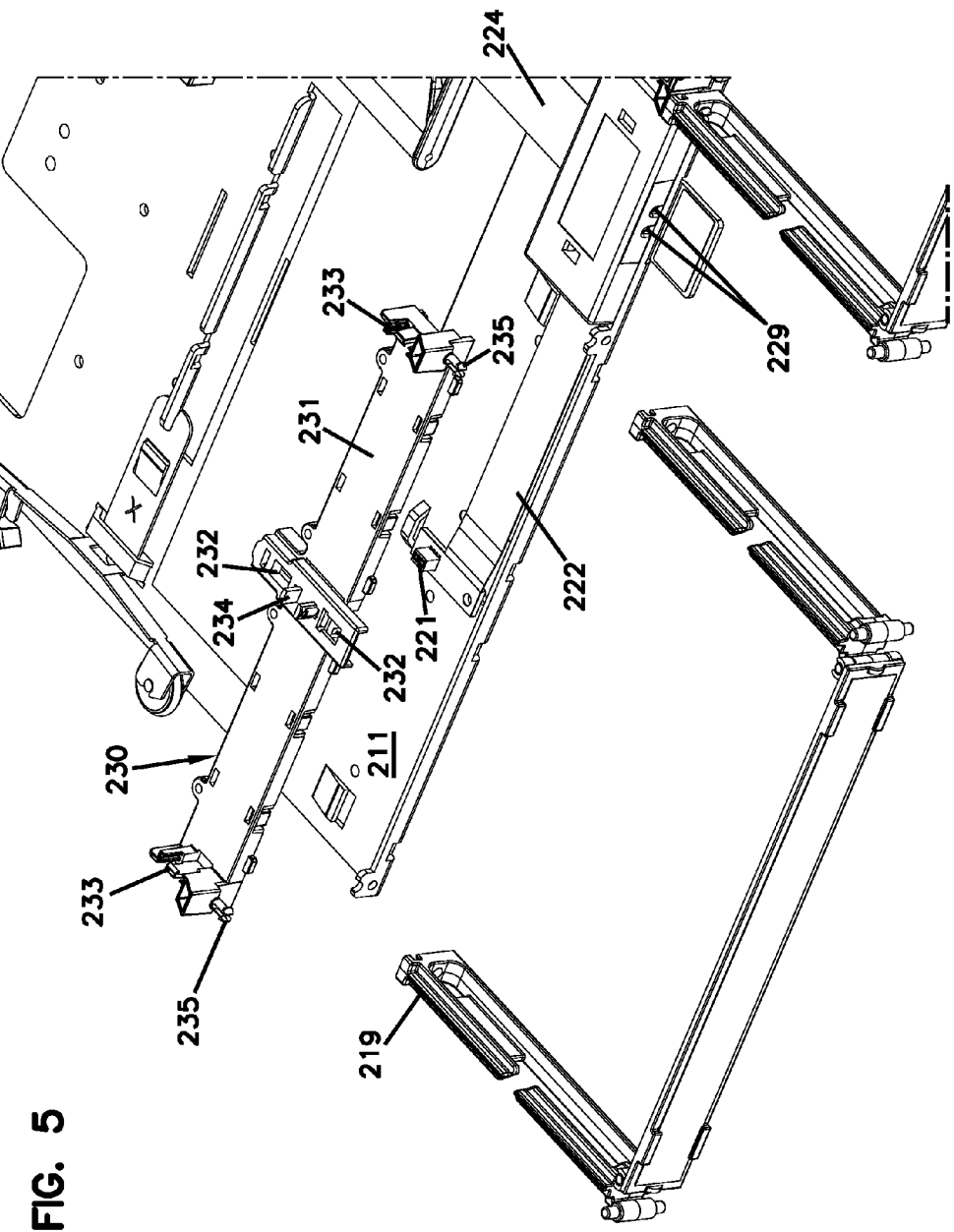
FIG. 5 is an enlarged view of the blade of FIG. 4 with cable managers exploded away from one of the cover members.
Figure 6:
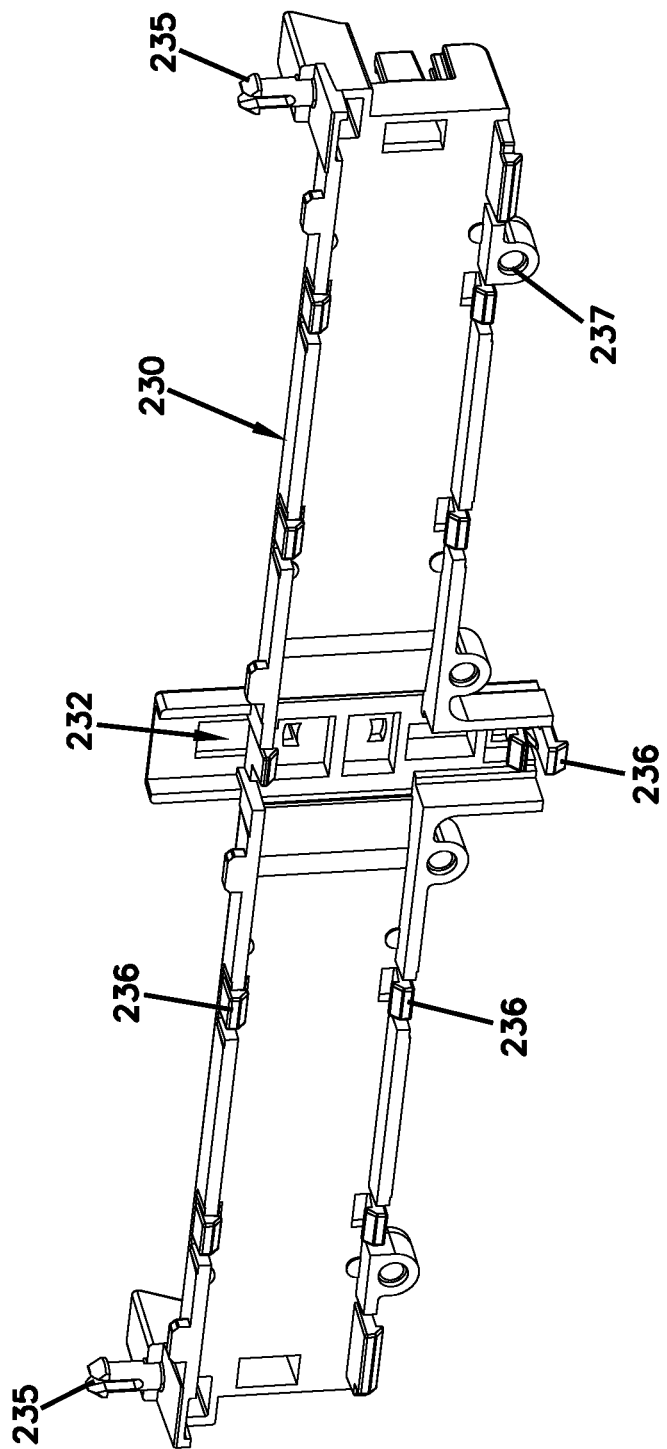
FIG. 6 is a bottom perspective view of one of the cover members of FIG. 4.

As shown in FIGS. 5 and 6, certain types of cover members 230 include a body 231 that extends over the first portion 222 of the circuit arrangement 220. In certain examples, the first portion 222 of the circuit arrangement 220 includes a flexible circuit board and the cover body 231 provides protection to the flexible circuit board and/or holds the flexible circuit board in place on the blade base 211. In certain examples, the cover body 231 can be held to the blade base 211 using latch members 236 and/or fastener mounts 237. In other examples, the cover body 231 can be otherwise secured to the blade 210.

The cover body 231 defines an opening 232 through which one of the coupler connector 221 of the circuit arrangement 220 or the output connector 254 of a media coupler 250 can extend to connect to the other. In certain examples, the cover body 231 defines two openings 232 where the connector 221, 254 can extend through either one depending on the configuration of the media coupler 250.

In certain implementations, the cover body 231 includes mounting structures for retaining a media coupler 250. In certain examples, two latching arrangements 233 extend upwardly from opposite sides of the cover body 231. The latching arrangements 233 are configured to latch or otherwise retain corresponding structure on opposite sides of the media coupler 250 to hold the media coupler 250 to the cover body 231. In other examples, the cover body 231 can include other retention structure for securing the media coupler 250 to the blade 210.

In certain examples, the cover body 231 includes another retention structure disposed at the opening 232 to enhance the connection between the media coupler 250 and the first portion 222 of the circuit arrangement 220. For example, latching arms 234 may extend upwardly from the cover body 231 at the opening 232. The latching arms 234 mate with corresponding structure on the media coupler 250 to hold the output connector 254 of the media coupler 250 to the coupler connector 221.

For example, the media coupler 250A shown in FIG. 7 includes mounting structure 256 at opposite ends thereof. The media coupler 250A also includes the output connector 254 at a central location along a length of the media coupler

250. A latching receptacle 258 is defined adjacent to the output connector 254. When the media coupler 250A is mounted to the blade 210, the mounting structure 256 engages the latching arrangements 233 of the cover member 230. The latching arms 234 extend into the latching receptacle 258. The output connector 254 mates with the coupler connector 221.

In certain implementations, the cover member 230 also includes mounting locations 235 for cable managers and/or port labels. For example, the cover member 230 shown in FIG. 5 includes latching arms 235 extending forwardly of the cover body 231. Cable managers 219 can latch, friction fit, or otherwise secure to the cover member 230 at the mounting locations 235. In some examples, the cable managers 219 can be assembled to the cover member 230 before the cover member 230 is installed on the blade 210. In other examples, the cable managers 219 can be assembled to the cover member 230 after the cover member 230 is installed on the blade 210.

In certain implementations, a circuit cover 238 can be mounted over the connection between the first portion 222 of the circuit arrangement 220 and the second portion 224 of the circuit arrangement 220. In certain examples, the circuit cover 238 is disposed between two cover members 230. In certain implementations, the circuit cover 238 defines one or more apertures 239 through which light from light indicators can be viewed. The light indicators can be mounted to the first portion 222 of the circuit arrangement 220 to identify the blade 210 and/or indicate a status of the blade 210.

Figure 10:
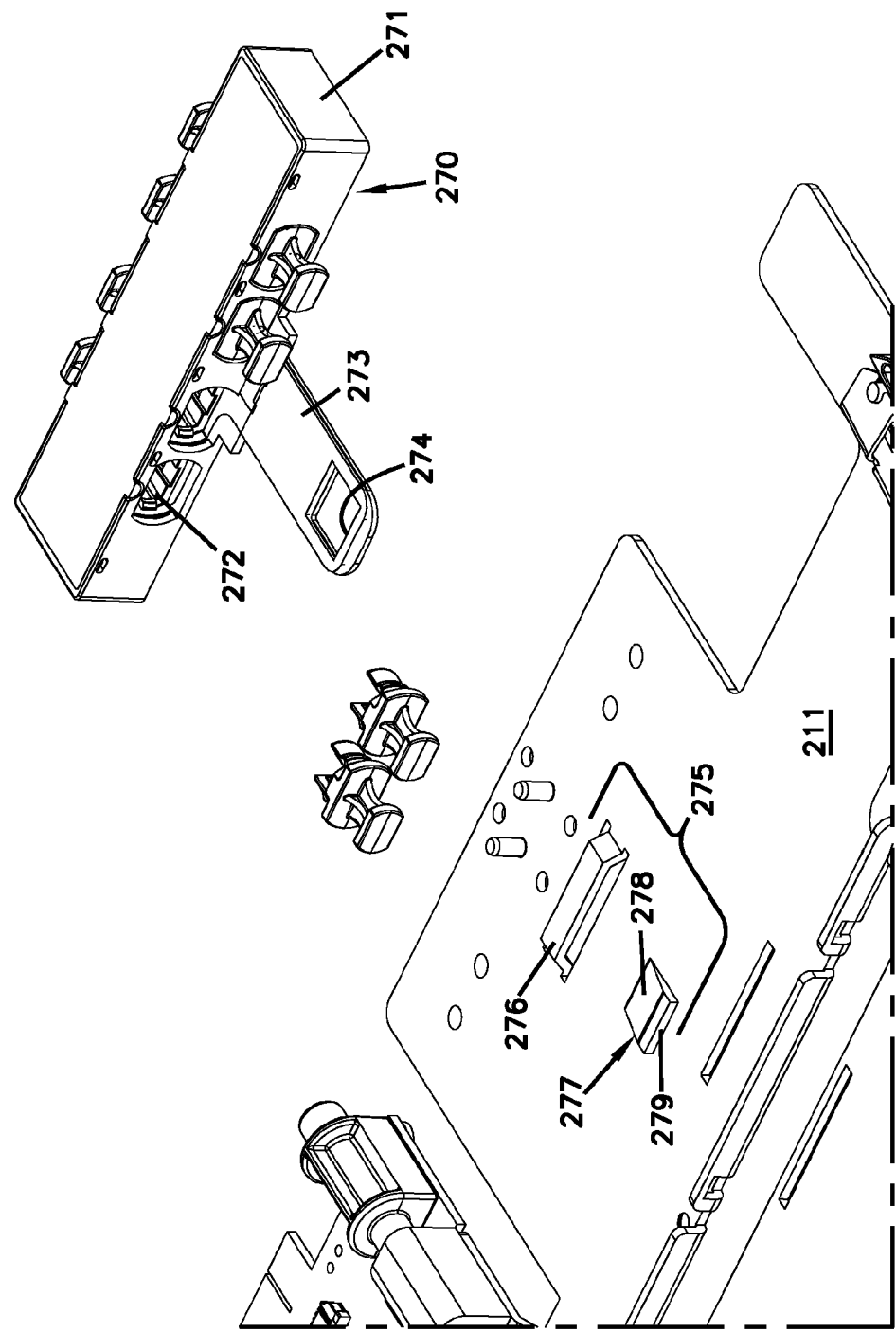
FIG. 10 illustrates an example media coupler suitable for use at a rear of the blade of FIG. 3.

Certain types of blades 210 include one type of media couplers at the rear for multiple media connections and another type of media couplers at the front for single media connections. For example, a blade 210 may have multi-fiber optical adapters disposed at the rear and single-fiber optical adapters disposed at the front. FIG. 10 illustrates another example media coupler 270 that mounts to the rear of the blade 210. The media coupler 270 is configured to attach to the blade base 211 without separate fasteners.

The media coupler 270 includes a body 271 defining one or more front ports 272 and one or more rear ports 272. The body 271 is movable as a unit and is secured to the blade base 211 as a unit. The body 271 includes a forwardly extending flange 273 structured to mate with a securement arrangement 275 on the blade 210. The flange 273 defines an aperture 274 at a distal end of the flange 273. The flange 273 is sufficiently flexible to enable the distal end of the flange 273 to deflect relative to the body 271.

The securement arrangement 275 includes a bridge member 276 and a ramped shoulder 277. The ramped shoulder 277 defines a ramped surface 278 facing the bridge 276 and an abutment surface 279 facing away from the bridge. To secure the media coupler 270 to the base 211, the media coupler 270 is positioned so that the forwardly extending flange 273 aligns with the bridge 276. The media coupler 270 is moved forwardly so that the flange 273 is slid under the bridge 276 towards the ramped shoulder 277. The media coupler 270 continues to be slid forward so that the distal end of the flange 273 cams over the ramp 278 and snaps over the abutment surface 279. The combination of the abutment surface 279 and the bridge 276 retain the flange 273, and hence the media coupler 270, at the base 211.

In certain examples, the latching arrangement 215 is installed on the blade using the same securement mechanism.

Figure 11:
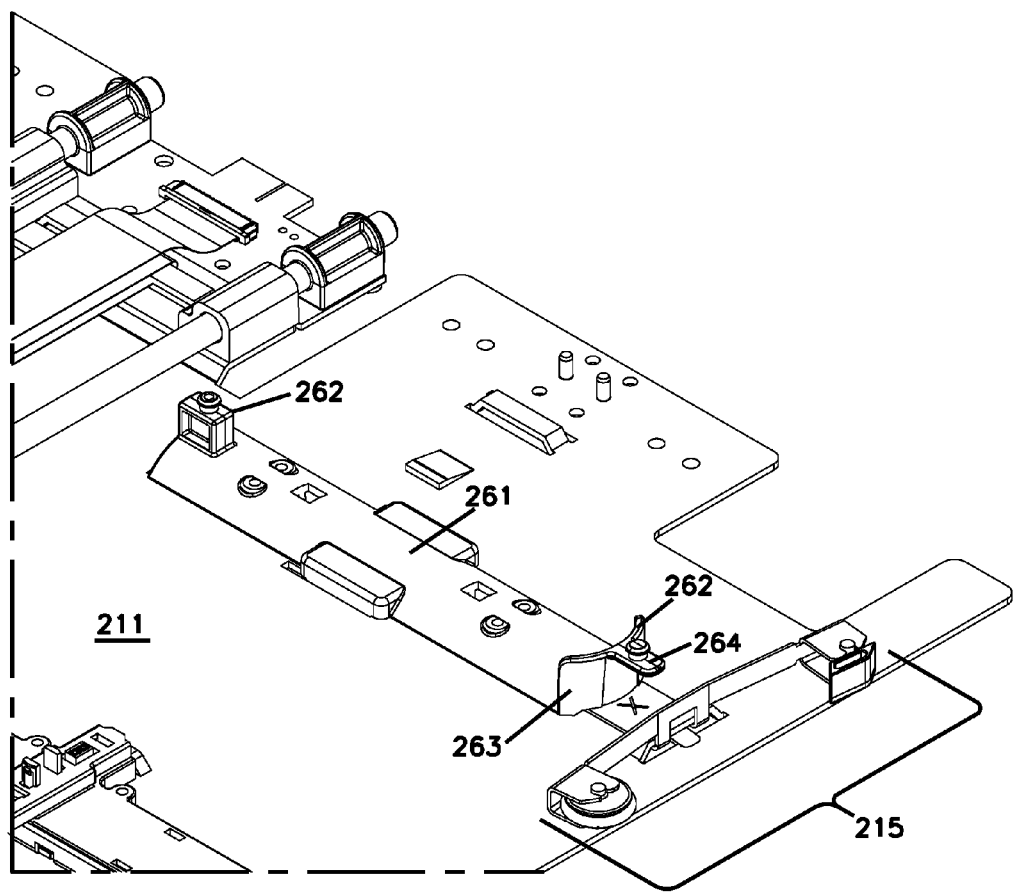
FIGS. 11 and 12 illustrate an example cable routing structure suitable for use with the blade of FIG. 3.
Figure 12:
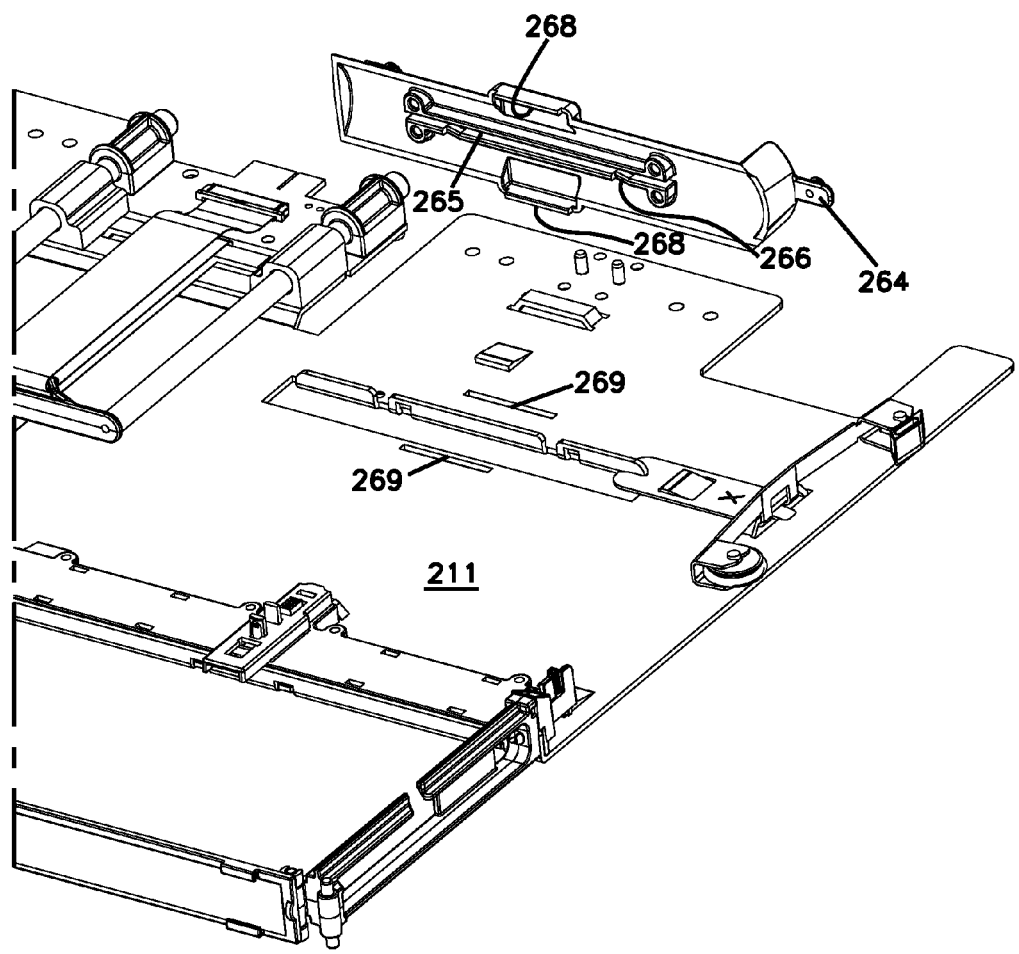

In accordance with some aspects of the disclosure, various management structures can be installed on the blade 210 to aid in guiding cables over the blade 210. FIGS. 11 and 12 illustrate an example cable management structure 260 installed on the blade 210. The cable management structure 260 includes a curved surface 261 that protects cables routed across the blade 210 from otherwise sharp or had edges on the blade base 211. For example, as shown in FIG. 12, the latching arrangement 215 can secure to an upward flange that extends laterally across the blade 210. The cable management structure 260 can mount over the upward flange to provide a smooth surface over which cables can be routed.

In certain implementations, an end of the cable management structure 260 defines a bend radius limiter 263 that limits the amount a cable routed along the limiter 263 can bend. The bend radius limiter 263 also allows for separation of cables routed across the blade (i.e., some cables route across the curved surface 261 and other cables route along the bend radius limiter 263. A finger 264 can extend outwardly from the bend radius limiter to aid in retaining the cables at the limiter 263.

In the example shown in FIG. 12, the cable management structure 260 includes guides 265 defining a channel into which the upward flange of the blade base 211 extends. Flexible members 266 on the guides 265 clamp to the upward flange to hold the cable management structure 260 to the blade 210. In certain examples, the cable management structure 260 includes tabs 268 that fit into slots 269 defined in the blade base 211. In some examples, the tabs 268 and slots 269 aid in alignment of the cable management structure 260 during installation. In other examples, the tabs 268 latch, friction fit, or otherwise secure into the slots 269.

In certain implementations, however, loose cables are not routed across the blade 210. Rather, any optical fibers 259 routed across the blade 210 are stuck to a flexible substrate to form a flexible optical circuit 257 (e.g., see FIG. 3). The substrate retains the fibers 259 in a fixed position during movement of the blade 210. In certain examples, the fibers 259 of the circuit are encapsulated in the substrate. The flexible optical circuit 257 can be designed and manufactured to route the fibers 259 around any sharp edges. More details on a suitable fiber sheet can be found in WO2014/052441, the disclosure of which is hereby incorporated herein by reference.

In certain implementations, each flexible optical circuit 257 is utilized to transition optical fibers 259 between a conventional connector, such as an MPO connector, that is disposed toward the rear of the blade 210 and a plurality of single-fiber connectors (e.g., non-conventional connectors) that are each configured to plug into a port of a media coupler 250. It should be noted that the term "non-conventional connector" may refer to a fiber optic connector that is not of a conventional type such as an LC or SC connector and one that has generally not become a recognizable standard footprint for fiber optic connectivity in the industry. The elimination of conventional mating connectors at the media couplers 250 may significantly reduce the overall size of the connector and allow for the needed bends of the fibers 259 without violating bend radius requirements. Examples of non-conventional connectors similar to those depicted in the present application are illustrated and described in U.S. Publication No. 2015/0260927, the entire disclosure of which is incorporated herein by reference.

Figure 15:
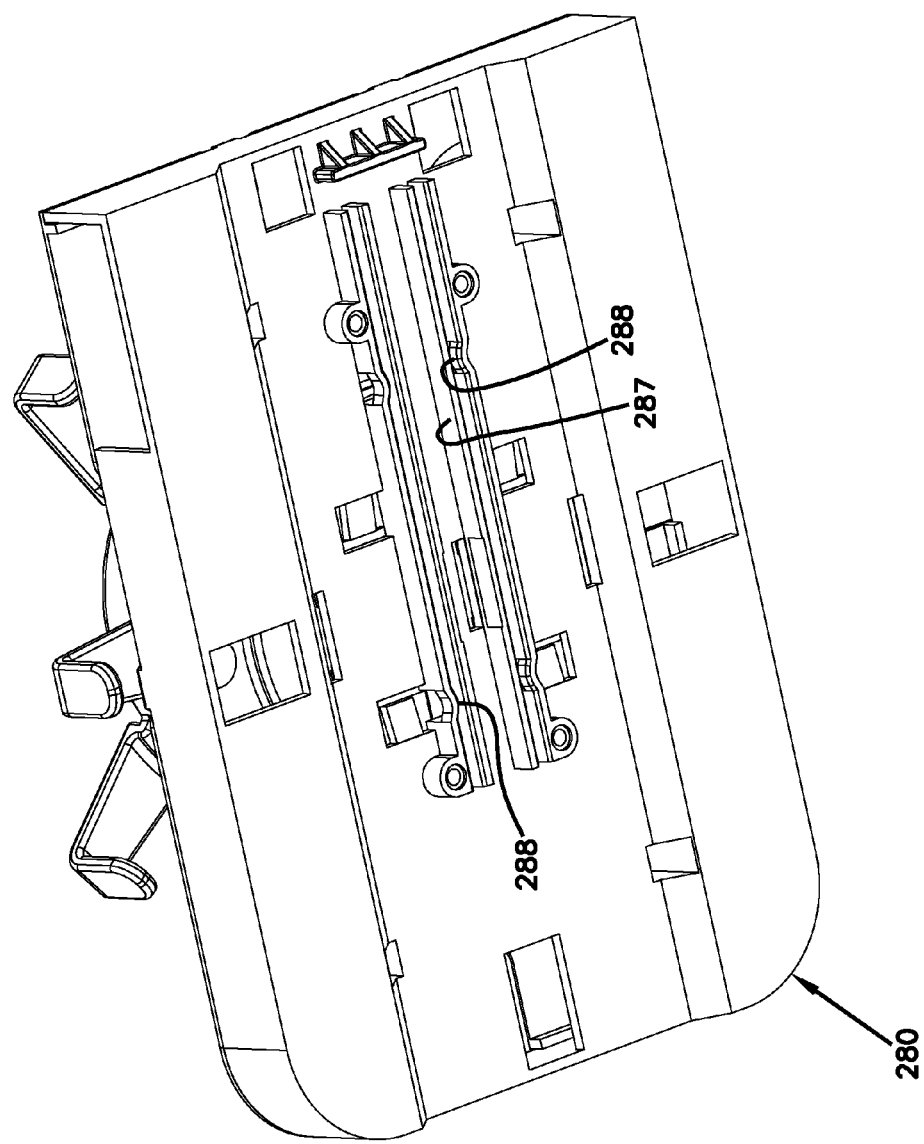

In other implementations, the blade 210 can include a splice tray arrangement 280 that protects and manages optical fibers and optical splices between the optical fibers. The splice tray arrangement 280 includes a splice tray 281 having one or more sidewalls 282 that define an interior. One or more retention fingers 283 extend inwardly from a top of the sidewall 282 to retain fibers within the interior. The sidewall 282 defines one or more apertures 284 at which fibers can enter and exit the splice tray 281. As shown in FIG. 15, a splice mounting region 285 is disposed in the splice tray 281. One or more bend radius limiters 286 are disposed around a perimeter of the splice mounting region 285 to facilitate routing the optical fibers from the apertures 284 to the splice mounting region 285.

The splice tray 281 is configured to mount to the blade base 211. In the example shown in FIG. 15, a bottom of the spice tray 281 includes guides 287 that define a channel therebetween in which to receive a flange of the blade base 211. The guides 287 include deflectable structures 288 that engage the upward flange of the blade base 211. In an example, the deflectable structures 288 are dimples in the guides 287. In other examples, the deflectable structures 288 can be cantilevered flanges or other such structures.

Figure 13:
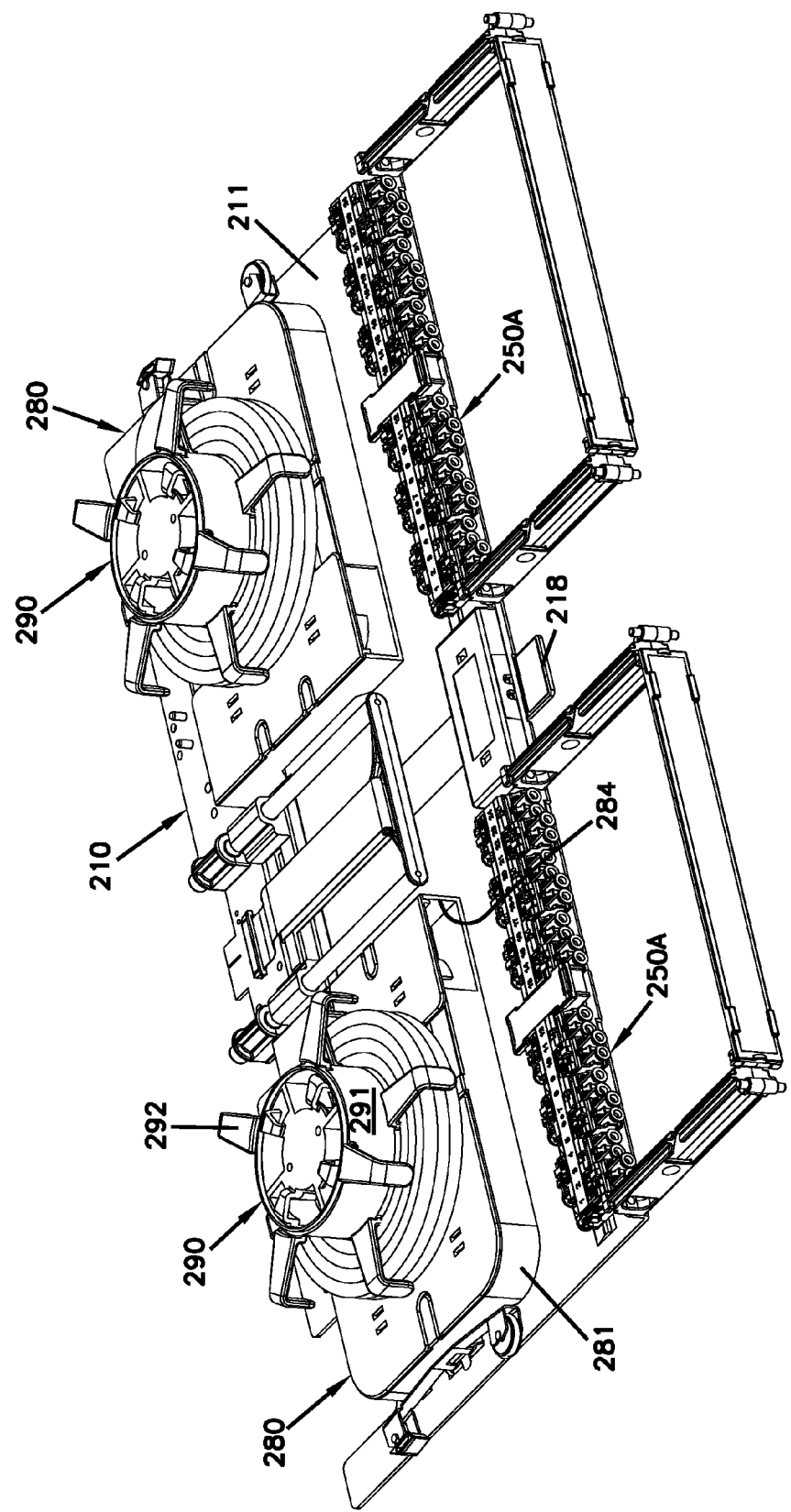
Figure 14:
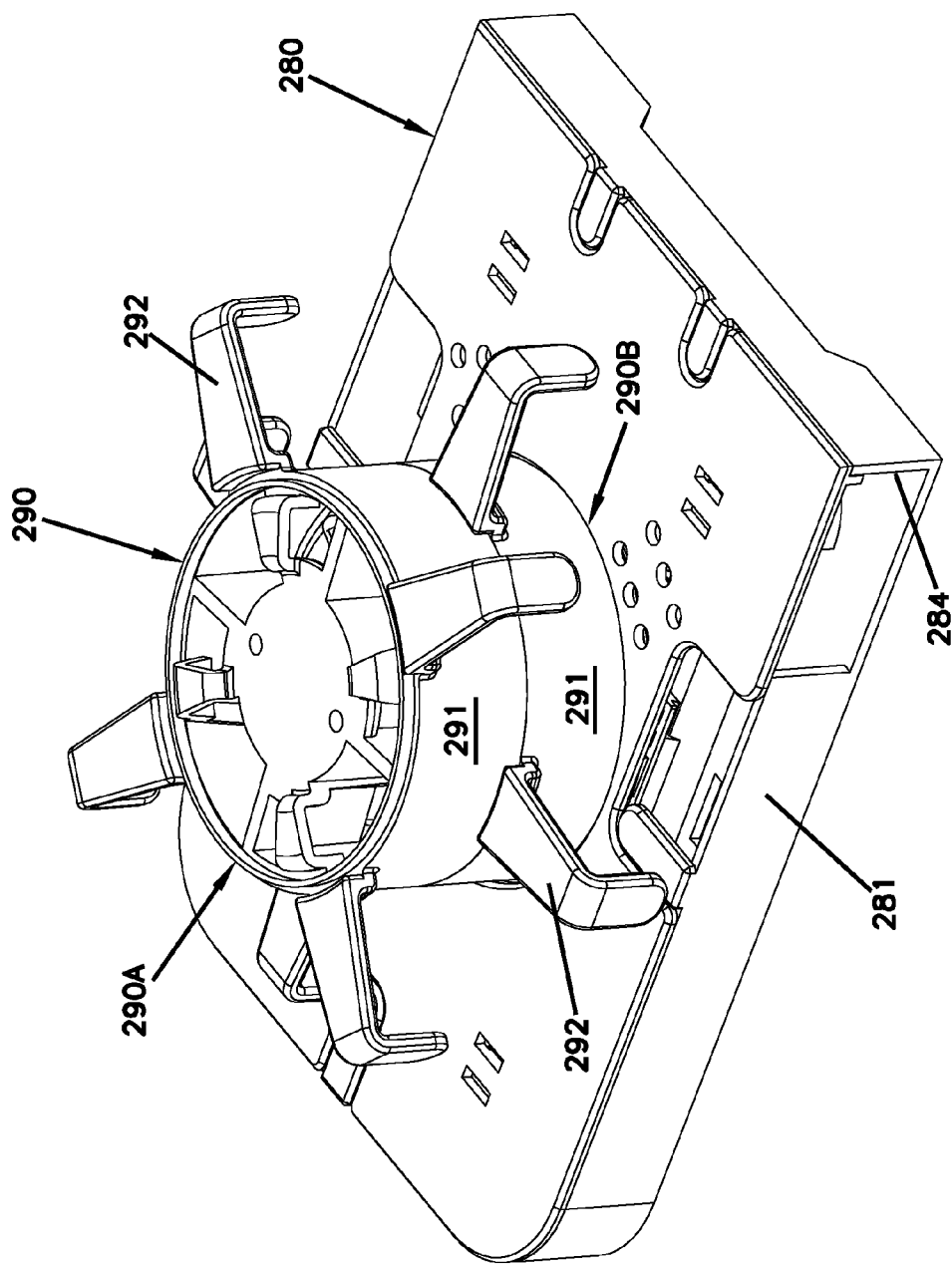

As shown in FIGS. 13 and 14, one or more cable spools 290 can be mounted to the splice tray 281. Each cable spool 290 includes a bend radius limiter surface 291 about which optical fibers can be wound. In certain examples, retention arms 292 extend outwardly from the bend radius limiter surface 291 to aid in retaining fibers on the bend radius limiter surface 291. In certain implementations, the spools 290 are stackable. For example, in FIG. 14, two spools 290A, 290B are shown stacked one on the other.

Systems, devices or methods disclosed herein may include one or more of the features structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

What is claimed:

1. A bladed chassis system comprising:
    a chassis defining an interior, the chassis including guides disposed within the interior, the chassis including an electrical backplane; and
    a blade mounted to the guides to enable the blade to move relative to the chassis, the blade including:
        a circuit arrangement including a flexible circuit board disposed at a front of the blade, the flexible circuit board including a module connector, the circuit arrangement also including a backplane connector at a rear of the blade, the backplane connector being configured to electrically couple to the electrical backplane of the chassis, the backplane connector being electrically coupled to the module connector; and
        a cover member that couples to the blade over a portion of the flexible circuit board, the cover member having an aperture that accommodates the module connector, the cover member also including mounting structure.

2. The bladed chassis system of claim 1, further comprising an adapter module that is separable from the blade as a unit, the adapter module including an adapter coupled to an electronics unit, the adapter defining at least two ports configured to receive and align respective plug connectors, the electronics unit having a blade connector that mates with the module connector of the circuit arrangement of the blade.

3. The bladed chassis system of claim 2, wherein the adapter module is a first adapter module; and further comprising a second adapter module including a second adapter coupled to a second electronics unit, the second adapter defining at least two ports configured to receive and align respective plug connectors, the second electronics unit having a second blade connector that mates with a second module connector of the circuit arrangement of the blade.

4. The bladed chassis system of claim 3, wherein the first and second adapter modules are elongated along a length; and wherein the first and second adapter modules are disposed so that the length of each adapter module extends along the front of the blade, wherein the first and second adapter modules are spaced from each other.

5. The bladed chassis system of claim 2, wherein the adapter module includes a media reading interface disposed at the adapter and includes a processor electrically connected to the media reading interface and to the blade connector.

6. The bladed chassis system of any of the preceding claims, wherein the adapter module supports cable retention fingers.

7. The bladed chassis system of claim 6, wherein labels are disposed at distal ends of the cable retention fingers from the adapter module.

8. The bladed chassis system of claim 1, wherein the mounting structure of the cover member includes a latch finger disposed at opposite ends of the cover member.

9. The bladed chassis system of any of the claim 8, wherein the mounting structure of the cover member includes latch fingers disposed at a central part of the cover member.

10. The bladed chassis system of claim 1, wherein the cover member couples to the blade without the use of separate tools, wherein the adapter module couples to the cover member without the use of separate tools.

11. The bladed chassis system of claim 1, wherein an adapter unit mounts to the rear of the blade.

12. The bladed chassis system of claim 1, wherein a cable management structure is disposed at the blade between the front and rear of the blade, the cable management structure having a curved surface that faces away from a surface of the blade.

13. The bladed chassis system of claim 1, further comprising a splice tray arrangement disposed at the blade.

14. The bladed chassis system of claim 13, wherein a cable spool is mounted to the splice tray arrangement.

15. The bladed chassis system of claim 1, wherein the blade includes a latching arrangement for releasably locking to the chassis at a predetermined position.

16. The bladed chassis system of claim 1, wherein the circuit arrangement is configured to maintain an electrical connection between the backplane connector and the backplane of the chassis during movement of the blade relative to the chassis.

17. A blade comprising:
    a base extending between a front and a rear, the base also extending between first and second sides;
    a circuit arrangement disposed at the base, the circuit arrangement including a flexible circuit board disposed at the front of the base, the flexible circuit board including a module connector, the circuit arrangement also including a backplane connector at the rear of the base, the backplane connector being electrically coupled to the module connector;

a cover member installed at the blade over a portion of the flexible circuit board, the cover member providing access to the module connector, the cover member also including mounting structure; and an adapter module coupled to the cover member at the mounting structure, the adapter module defining a plurality of ports, the adapter module also including an electronics unit including a processor and a media reading interface associated with a respective one of the ports, the adapter module including a blade connector that mates with the module connector of the circuit arrangement.

18. The blade of claim 17, further comprising a cable manager carried by the cover member, the cable manager extending forwardly of the base to a distal end.

19. The blade of claim 17, further comprising a label panel coupled to the distal end of the cable manager.

20. The blade of any of claims 17-19, wherein the blade does not have a processor separate from the processor of the electronics units of the adapter modules.

\* \* \* \* \*